United States Patent [19]

Hatakenaka et al.

[11] Patent Number: 5,487,097
[45] Date of Patent: Jan. 23, 1996

[54] PERIOD MEASURING DEVICE

[75] Inventors: Makoto Hatakenaka, Itami; Haruo Sakurai, Nagasaki; Hideo Nagano, Itami, all of Japan

[73] Assignee: Mitsubishi Denki Kabushiki Kaisha, Tokyo, Japan

[21] Appl. No.: 291,285

[22] Filed: Aug. 16, 1994

[30] Foreign Application Priority Data

Aug. 23, 1993 [JP] Japan .................................. 5-207791

[51] Int. Cl.$^6$ .................................................. G01R 23/10
[52] U.S. Cl. ........................... 377/20; 377/55; 327/265
[58] Field of Search ............................ 377/20, 55, 56; 327/265

[56] References Cited

U.S. PATENT DOCUMENTS

| | | | |
|---|---|---|---|
| 3,745,475 | 7/1973 | Turner | 377/20 |
| 3,878,370 | 4/1975 | Santomango et al. | 377/20 |
| 4,001,561 | 1/1977 | Quaintance | 377/20 |
| 4,085,373 | 4/1978 | McConnell | 327/265 |
| 5,382,910 | 1/1995 | Walsh | 377/20 |

FOREIGN PATENT DOCUMENTS 1-232393  9/1989  Japan .

*Primary Examiner*—John S. Heyman
*Attorney, Agent, or Firm*—Oblon, Spivak, McClelland, Maier & Neustadt

[57] ABSTRACT

It is an object to accurately obtain the period of the horizontal synchronizing signal in the video signal. The number of internal pulses are measured in a predetermined measurement period defined by the horizontal synchronizing signal. It is assumed that the periods of the horizontal synchronizing signal and the internal pulse are denoted as $T_H$ and $T_S$, and the measurement period is defined by one period of a divided signal NS which is obtained by N-dividing the horizontal synchronizing signal. In this case, the length of the measurement period is $N \cdot T_H$. The period of the horizontal synchronizing signal is obtained when the internal pulse is activated K times in the measurement period. After the measurement period is started, the divided signal NS transits between the Kth activation of the internal pulse and the (K+1)th activation, and the measurement period is ended. Accordingly, there is the relation of $T_S \cdot K < N \cdot T_H < T_S \cdot (K+1)$. The error $\epsilon = T_S/N$, where the error $\epsilon$ dose not increase even if the period $T_H$ of the horizontal synchronizing signal becomes long.

22 Claims, 21 Drawing Sheets

F I G. 10
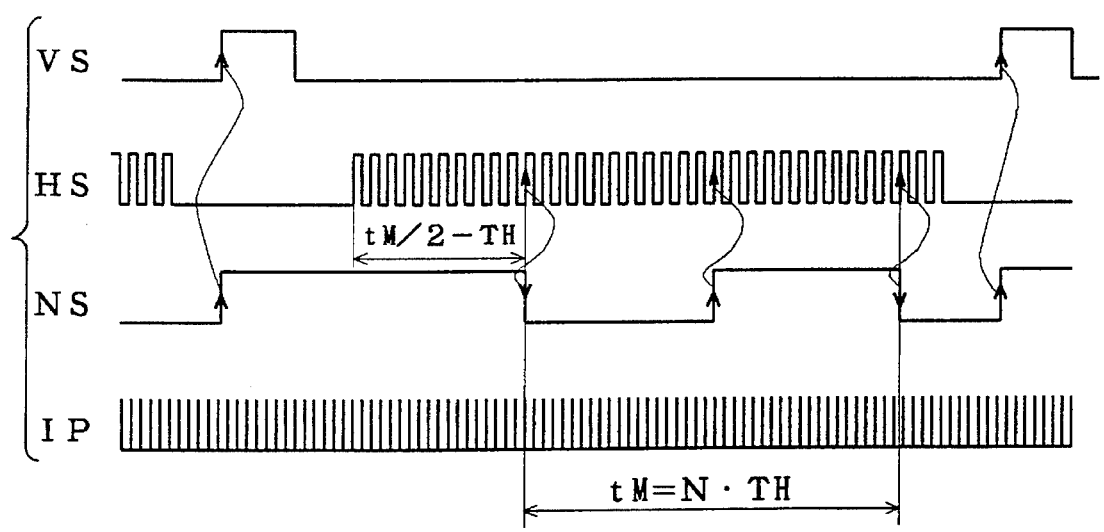

PERIOD MEASURING DEVICE

BACKGROUND OF THE INVENTION

1. Field of the Invention

The present invention relates to devices for measuring periods of signals which are periodically activated, and particularly to a device for measuring a period of a horizontal synchronizing signal in a video signal and a picture signal.

2. Description of the Background Art

The display monitors of computers have conventionally included ones of multi-scanning type which make a display on the basis of video signals from a plurality of computers. Now, the periods of the horizontal synchronizing signals and the vertical synchronizing signals in the video signals are not the same among the plurality of computers. Accordingly, a setting in the display monitor must be changed corresponding to the video signals from the individual computers. More specifically, the periods of the horizontal synchronizing signals must be measured to make settings in correspondence with the periods.

The horizontal synchronizing signals may be made to be lacking in the vertical blanking intervals, particularly in the vertical synchronizing periods. Even in such a case, the periods of the horizontal synchronizing signals must be measured.

FIG. 22 is a block diagram for illustrating the structure of a conventional period measuring device 200 and FIG. 23 is a timing chart for illustrating the operation thereof. The period measuring device 200 can measure the periods of the horizontal synchronizing signals which are made to be lacking in the vertical synchronizing periods.

A horizontal synchronizing signal HS and a vertical synchronizing signal VS are applied to a microcomputer 1. The microcomputer 1 has an internal pulse oscillator 2 for generating an internal pulse IP and an internal counter 3. The internal pulse IP depends on a system clock which serves as a basis of the operation of the microcomputer 1.

The horizontal synchronizing signal HS is activated several times between adjacent activated vertical synchronizing signal VS. The period measuring device 200 measures how many times the horizontal synchronizing signal HS is activated in a certain measurement period $t_m$.

Specifically, the measurement period $t_m$ starts when a certain waiting time $t_w$ has passed after the vertical synchronizing signal VS is activated. The measurement period $t_m$ and the waiting time $t_w$ are both set on the basis of the internal pulse IP, and for example, they are set to 1 ms and 5 ms, respectively. Then, the number of pulses of the horizontal synchronizing signal HS which are activated in the measurement period $t_m$ is counted by the internal counter 3.

Now, when the count value of pulses of the horizontal synchronizing signal HS which is measured in the measurement period $t_m$ is C, if the actual period of the horizontal synchronizing signal HS is represented by $T_H$, then the expression (1) holds.

$$t_m/(C+1) < T_H < t_m/C \quad (1)$$

Accordingly, an error in the measurement of the period of the horizontal synchronizing signal HS by the period measuring device 200 is $$\epsilon = t_m/C - t_m/(C+1) \quad (2)$$

As described above, the conventional art has a problem that the count value C becomes smaller as the period $T_H$ of the horizontal synchronizing signal HS becomes longer, and thus the error $\epsilon$ increases. Especially, when the measurement period $t_m$ is short, this problem is considerable.

For example, if the measurement period $t_m$ is 5 ms and the period $T_H$ of the horizontal synchronizing signal HS is 1/(60 kHz), the error $\epsilon$ is 55 ns. However, if the period $T_H$ of the horizontal synchronizing signal HS is 1/(30 kHz), the error $\epsilon$ becomes four times, that is, 220 ns.

Furthermore, if the measurement period $t_m$ is 1 ms, even if the period $T_H$ of the horizontal synchronizing signal HS is 1/(60 kHz), the error $\epsilon$ becomes 270 ns which is 4.9 times.

SUMMARY OF THE INVENTION

The present invention is directed to a period measuring device for measuring a period of a first signal which is periodically activated. According to the present invention, the period measuring device comprises: (a) an input terminal for inputting a second signal which has a period larger than that of the first signal and has a predetermined relation with the first signal; (b) an oscillator for generating a third signal which has a period smaller than that of the first signal; (c) a first counter for counting the number of times of activation of the third signal in a measurement period determined by the second signal; and (d) operation means for obtaining the period of the first signal from output of the first counter, the period of the third signal and the predetermined relation.

Preferably, in the period measuring device according to the present invention, the predetermined relation is that the period of the second signal is an integer N multiple of the period of the first signal.

Preferably, the period measuring device according to the present invention further comprises: (e) a divider for N-dividing the first signal to generate the second signal and supplying it to the input terminal.

Preferably, in the period measuring device according to the present invention, the first signal is activated at least when a fourth signal which is periodically activated is inactive, and the divider has a second counter which is supplied with an initial value by the fourth signal which is active, and the second signal is obtained as an output of the second counter.

Preferably, in the period measuring device according to the present invention, the measurement period is an integer multiple of half of one period of the second signal.

Preferably, in the period measuring device according to the present invention, the measurement period corresponds to one period of the second signal.

Preferably, in the period measuring device according to the present invention, the measurement period corresponds to a half period of the second signal.

Preferably, the period measuring device according to the present invention further comprises: (f) latch means for holding an output of the first counter; and (g) read means for inputting an output of the latch means, wherein a first transition from inactive to active of the fourth signal causes reset of the first counter and the holding of the latch means, and the first counter performs the counting only between adjacent transitions having directions different from each other of the second signal.

Preferably, in the period measuring device according to the present invention, the second signal makes only two transitions in different directions in a period in which the fourth signal is continuously inactive.

According to the present invention, the first counter counts the number of activation of the third signal in the measurement period determined by the second signal. The second signal has a predetermined relation with the first signal. For example, the period of the second signal is an integer N multiple of that of the first signal.

If the measurement period is equal to one period of the second signal, the period of the third signal is $T_S$ and the third signal is activated K times in the measurement period, the period of the first signal is measured as $T_S \cdot K/N$.

According to the period measuring device of the present invention, the number of activation of the third signal is measured in the predetermined measurement period defined by the second signal, so that an increase in an error in the measurement can be avoided even if the period of the first signal is longer.

Accordingly, it is an object of the present invention to obtain a period measuring device which has small errors even if the period $T_H$ of the horizontal synchronizing signal HS is long and can measure it accurately.

These and other objects, features, aspects and advantages of the present invention will become more apparent from the following detailed description of the present invention when taken in conjunction with the accompanying drawings.

BRIEF DESCRIPTION OF THE DRAWINGS

FIG. 10 is a timing chart showing the operation of the second preferred embodiment of the present invention.

DESCRIPTION OF THE PREFERRED EMBODIMENT

A. Basic Idea:

Before starting the specific description of the present invention, the basic idea of the present invention will be described.

While the number of pulses of the horizontal synchronizing signal HS is measured in the predetermined period of measurement, $t_m$, which is defined by the internal pulse IP in the conventional art, the number of internal pulses IP in a predetermined period of measurement, $t_M$, which is defined by the horizontal synchronizing signal HS, is measured in the present invention. Now, the measurement period $t_M$ can be set by N-dividing the horizontal synchronizing signal HS.

Figure 1:
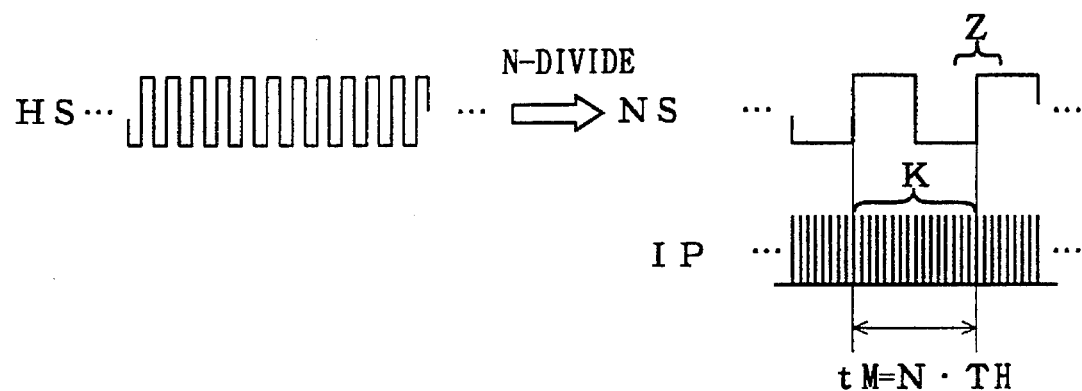
FIG. 1 is a conceptional diagram showing the basic idea of the present invention.
Figure 2:
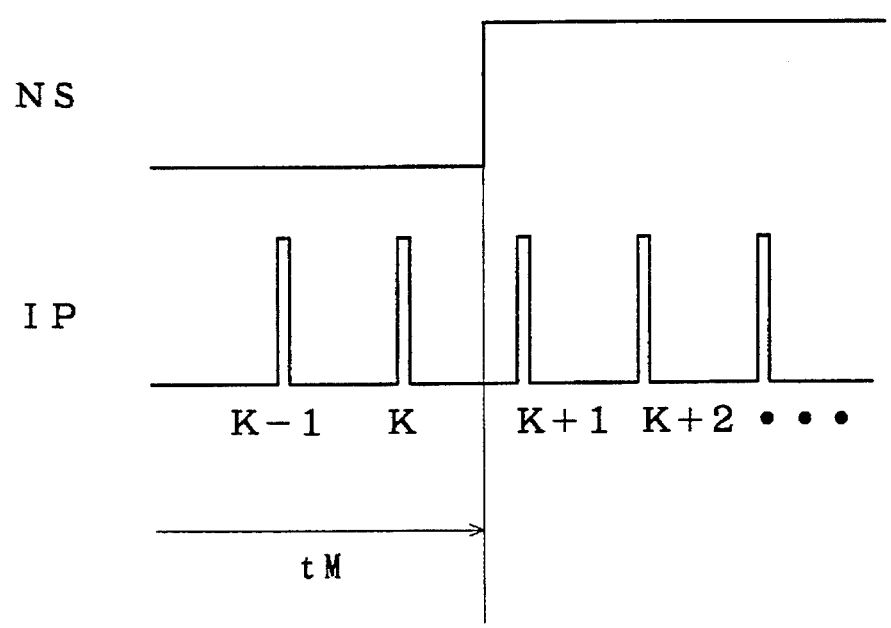
FIG. 2 is a conceptional diagram in which the part Z in FIG. 1 is shown being enlarged.

FIG. 1 is a conceptional diagram showing the basic idea of the present invention. FIG. 2 is a conceptional diagram in which the part Z in FIG. 1 is shown being enlarged. Now, the periods of the horizontal synchronizing signal HS and the internal pulse IP are represented by $T_H$, $T_S$, respectively, and it is assumed that the measurement period $t_M$ is set as one period of a divided signal NS obtained by N-dividing the horizontal synchronizing signal HS. When the period $T_H$ of the horizontal synchronizing signal HS is obtained from the case in which the internal pulse IP is activated K times in the measurement time $t_M$ as shown in FIG. 1, a certain error $\epsilon$ appears.

As shown in FIG. 2, after the measurement period $t_M$ is started, the divided signal NS makes a transition between the Kth activation and the (K+1)th activation of the internal pulse IP and the measurement period $t_M$ terminates. Accordingly, the expression (3) holds.

$$T_S \cdot K < t_M < T_S \cdot (K+1) \quad (3)$$

However, since $t_M = T_H \cdot N$, the error $\epsilon$ is given as, $$\epsilon = T_S \cdot (K+1)/N - T_S \cdot K/N = T_S/N \quad (4)$$

Now, the error $\epsilon$ dose not depend on the number K of activation of the internal pulse IP in the measurement period $t_M$.

Accordingly, not like the error $\epsilon$ in the conventional art shown by the expression (2), the error $\epsilon$ dose not increase if the period $T_H$ of the horizontal synchronizing signal HS becomes longer and the value of K becomes smaller. For example, if the value of dividing is N=256 and the period of the internal pulse IP is set to $T_S$=1 μs, the error $\epsilon$ is 3.9 ns, which shows that the period $T_H$ of the horizontal synchronizing signal HS can be measured accurately.

Now specific structures of the preferred embodiments based on the basic idea described above will be individually described in detail below.

Figure 3:
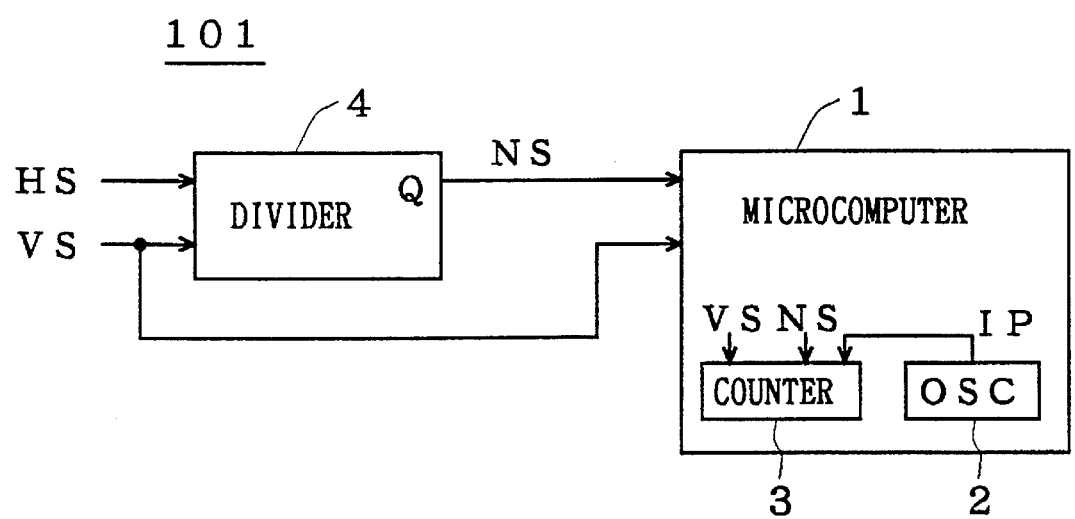
FIG. 3 is a block diagram showing the first preferred embodiment of the present invention.

B. Specific Structures of the Preferred Embodiments:

(B-1) First Preferred Embodiment;

FIG. 3 is a block diagram showing the structure of a period measuring device 101 according to the first preferred embodiment of the present invention. The period measuring device 101 has a divider 4. A horizontal synchronizing signal HS and a vertical synchronizing signal VS are inputted to the divider 4, which N-divides the horizontal synchronizing signal HS to output a divided signal NS. The divider 4 is reset by the vertical synchronizing signal VS.

The period measuring device 101 also has a microcomputer 1. The microcomputer 1 has an internal pulse oscillator 2 for generating an internal pulse IP and an internal counter 3. The internal counter 3 counts the number K, how many times the internal pulse IP is activated in the measurement period $t_M$ which corresponds to one period of the divided signal NS.

Figure 4:
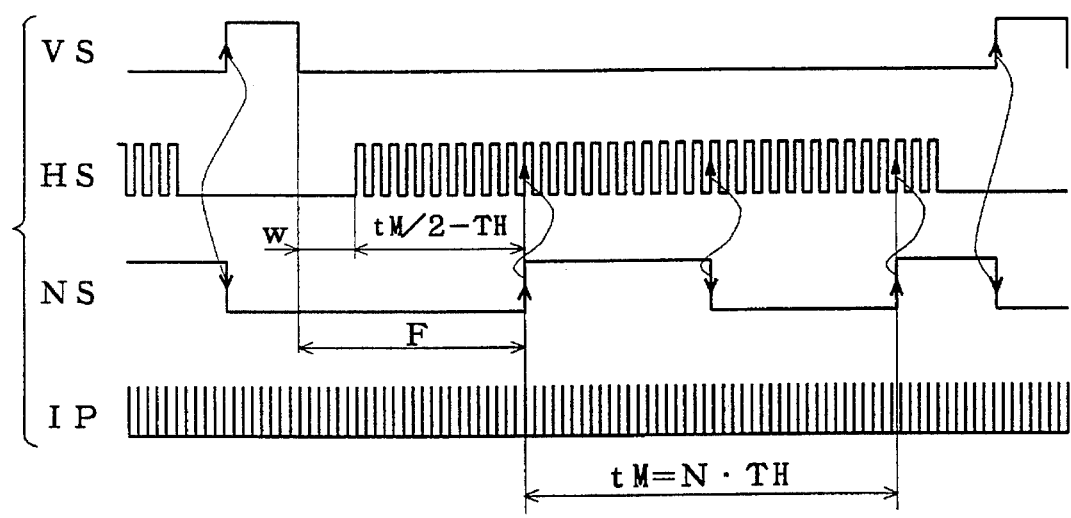
FIG. 4 is a timing chart for illustrating the operation of the first preferred embodiment of the present invention.
Figure 5:
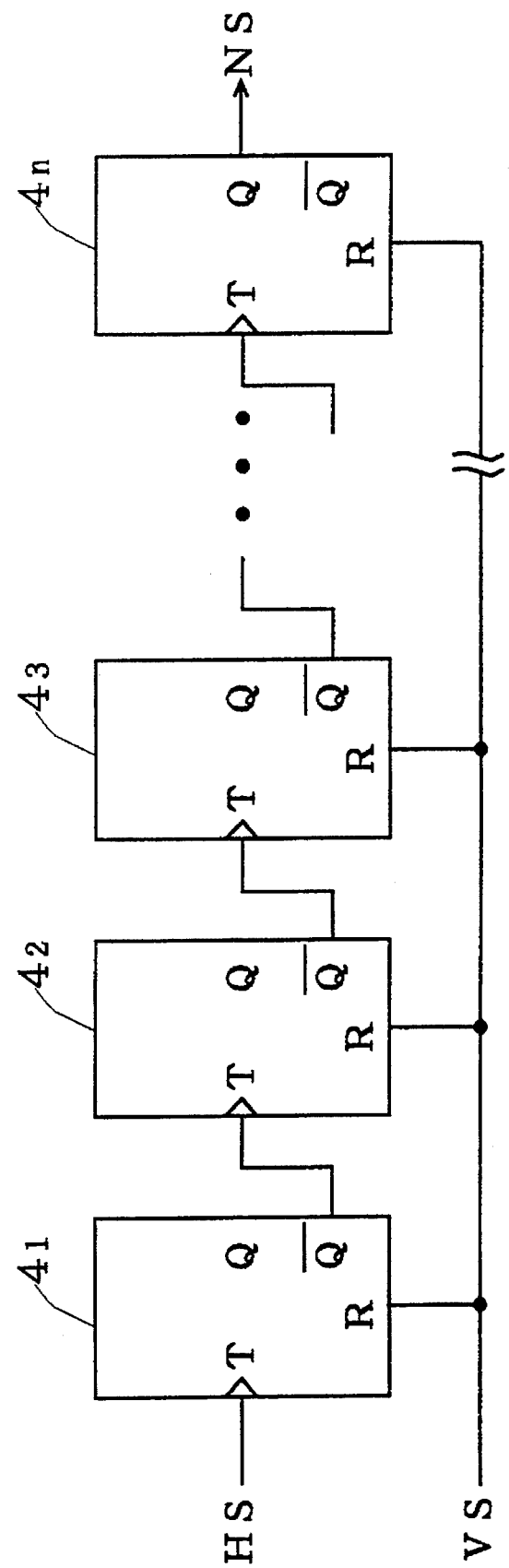
FIG. 5 is a circuit diagram showing an example of structure of the first preferred embodiment of the present invention.

FIG. 4 is a timing chart for illustrating the operation of the period measuring device 11. The divider 4 is reset by an "H" level of the vertical synchronizing signal VS and N-divides the horizontal synchronizing signal HS to generate the divided signal NS. FIG. 5 is a circuit diagram showing an example of the structure of a dividing circuit 4a which can be used for the divider 4. It has a structure in which T flip-flops $4_1, 4_2, 4_3, \ldots, 4_n$ are connected in series, where provided to clock input terminals T of the T flop-flops $4_2, 4_3, \ldots, 4_n$ are inversion Q outputs of individual previous stages. Provided to the clock input terminal T of the T flip-flop $4_1$ is the horizontal synchronizing signal HS. Furthermore, the vertical synchronizing signal VS is applied to reset terminals R of all the T flip-flops $4_1, 4_2, \ldots, 4_n$.

By using such a dividing circuit 4a as structured above for the divider 4, it is reset by the "H" level of the vertical synchronizing signal VS and the divided signal NS which is obtained by $2^n$-dividing the horizontal synchronizing signal HS can be obtained from the Q output of the T flip-flop $4_n$. Since the inversion Q output is applied to the clock input terminal T at the next stage, when rises of the horizontal synchronizing signal HS is counted $2^{(n-1)}$ times, the divided signal NS rises, and when it is counted $2^n$ times, it falls.

Referring to FIGS. 3 and 4 again, the counter 3 counts the number of activation of the internal pulse IP in the measurement period $t_M$, which is from the first rise of the divided signal NS after inactivation of the vertical synchronizing signal VS until the next rise thereof. When the divided signal NS is obtained by N-dividing the horizontal synchronizing signal HS having the period $T_H$, the measurement period $t_M$ is equal to $N \cdot T_H$. Also, because the divided signal rises after the rises of the horizontal synchronizing signal HS are counted $2^{(n-1)}$ times, if the time from when the vertical synchronizing signal VS becomes inactive and until when the horizontal synchronizing signal HS first rises is expressed as w, the measurement period $t_M$ starts when the vertical synchronizing signal VS becomes inactive and then a waiting time $F=(t_M/2-T_H+w)$ passes.

Figure 6:
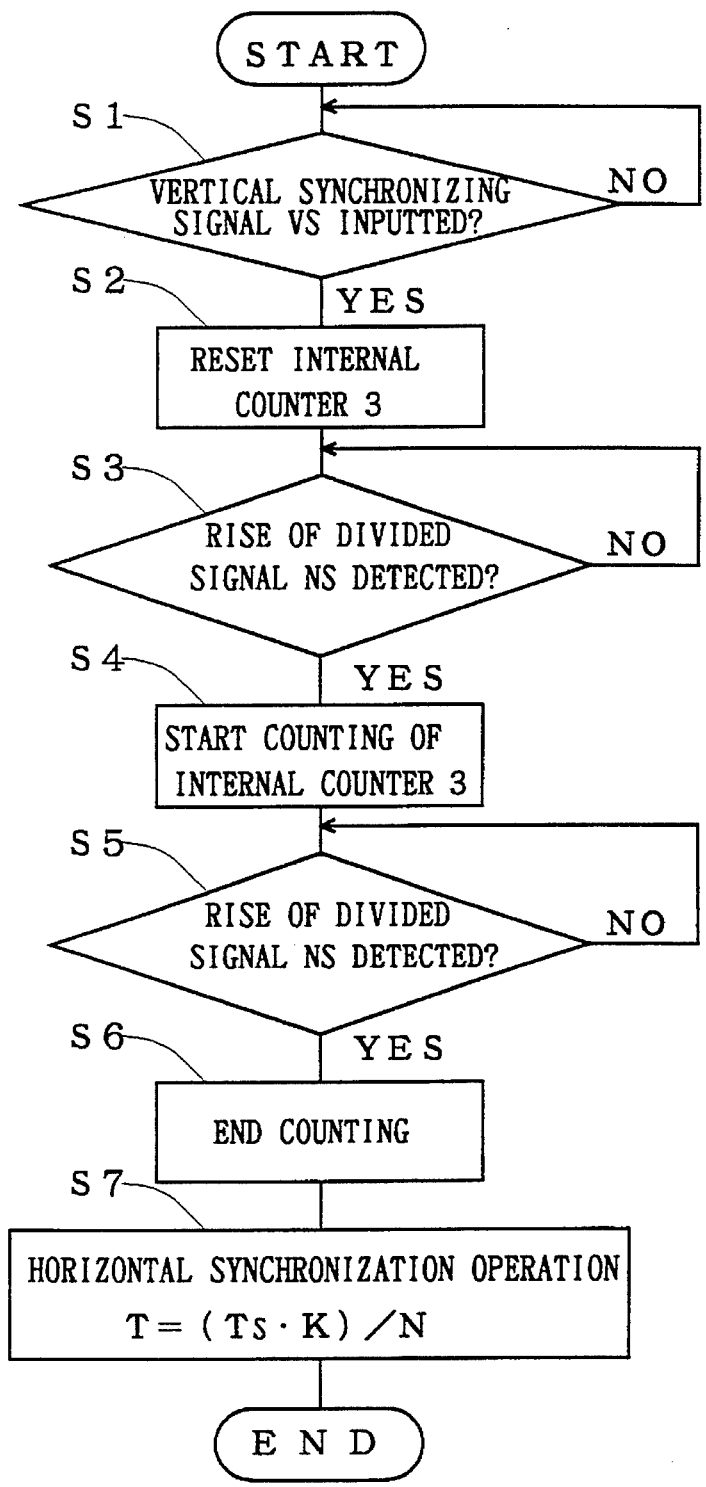
FIG. 6 is a flow chart showing the operation of the first preferred embodiment of the present invention.

FIG. 6 is a flow chart showing the operation of the period measuring device 101. The procedure illustrated in the flow chart is controlled by the microcomputer 1.

First, in step S1, a determination is made as to if the vertical synchronizing signal VS is inputted to the microcomputer 1 or not. If it has not been inputted yet, the determination in this step S1 is repeated. Then, when it is determined that the vertical synchronizing signal VS is inputted, the internal counter 3 is reset in step S2.

Then, a determination is made as to if a rise of the divided signal NS is detected or not in step S3. If it has not been detected yet, the determination in step S3 is repeated. When it is determined that a rise of the divided signal NS is detected, then counting of the internal pulse IP by the internal counter 3 is started in step S4.

Subsequently, in step S5, a determination is made again as to if a rise of the divided signal NS is detected or not. If it is not detected yet, the determination in step S5 is repeated. During this period, counting of the internal pulse IP by the internal counter 3 continues.

When it is determined that the rise of the divided signal NS is detected in step S5, counting of the internal pulse IP by the internal counter 3 terminates in step S6. The period from when the determination "YES" is made in step S3 until when the determination of "YES" is made in step S6 corresponds to the measurement period $t_M$. By counting by the internal counter 3 until this point, the number K of activation of the internal pulse can be obtained.

After that, the period of the horizontal synchronizing signal HS is obtained in step S7. Specifically, it is obtained as $T=T_S \cdot K/N$. As shown in the expression (4), the error $\epsilon$ from the real period $T_H$ of the horizontal synchronizing signal HS can be held smaller than $T_S/N$.

The period measuring device 101 is made and operates as described above, therefore, even if the period of the horizontal synchronizing signal HS is long, it can be accurately measured as described in "A. Basic Idea".

Description has been made about the example in which the vertical synchronizing signal VS is of the positive polarity (active and inactive correspond to "H" and "L", respectively) and reset of the divider 4 is accomplished by the "H" level of the vertical synchronizing signal VS. If the vertical synchronizing signal VS is of the negative polarity (active and inactive correspond to "L" and "H", respectively), however, reset of the divider 4 can be made by the "L" level thereof.

Figure 8:
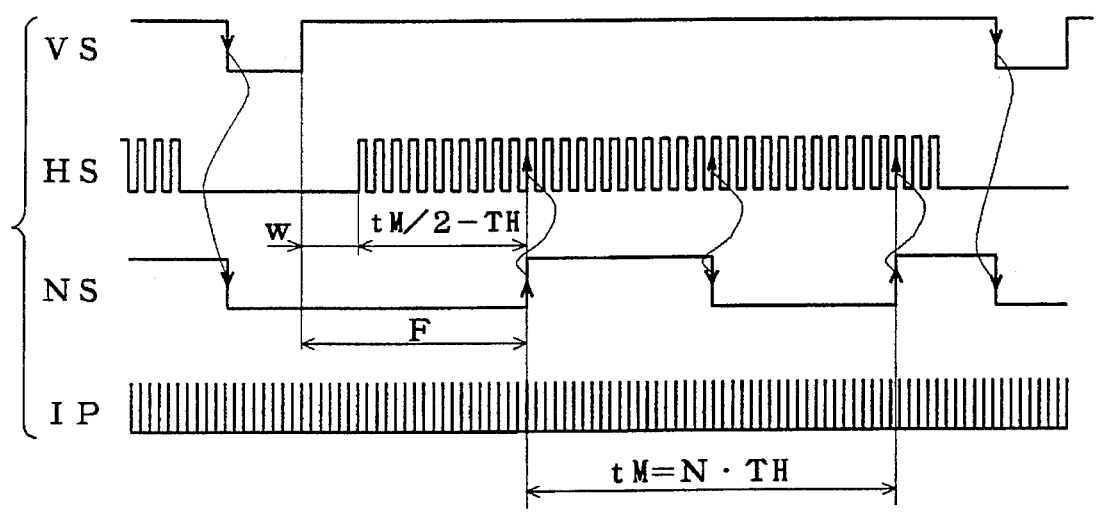
FIG. 8 is a timing chart for illustrating the operation of the first preferred embodiment of the present invention.

In such a case, a dividing circuit 4b which is composed of T flip-flops $4_1', 4_2', 4_3', \ldots, 4_n'$ connected in series in which reset is made with an "L" level signal can be used. FIG. 8 is a timing chart showing the operation of the period measuring device 101 in such a case.

As the measurement period $t_M$ is determined in the similar way to the operation shown in FIG. 4, even if the period of the horizonal synchronizing signal HS is long, it can be measured with high accuracy.

(B-2) Second Preferred Embodiment:

In the first preferred embodiment, a determination is made as to whether a rise of the divided signal NS is detected or not in steps S3 and S5 shown in FIG. 6, but a determination can be made as to if a fall of the divided signal NS is detected or not in steps S3 and S5. The length of the measurement period $t_M$ is equal in this case.

When the measurement period $t_M$ is determined on the basis of falls of the divided signal NS, it is desirable to make the divider 4 so that the value of the divided signal NS is at the "H" level immediately after the vertical signal VS becomes inactive. If the dividing circuits 4a and 4b are used as the divider 4 and the value of the divided signal NS is at the "L" level just after the vertical synchronizing signal VS becomes inactive, the waiting time F until the divided signal NS falls for the first time after the vertical synchronizing signal VS becomes inactive must be as long as one period of the divided signal NS or longer. That is to say, the period of the vertical synchronizing signal VS must be double the divided signal NS or longer in order to secure the measurement period $t_M$.

Therefore, if the period of the vertical synchronizing signal VS is short in the video signal generated from a computer connected to the monitor, the value of dividing, N, must be small. On the other hand, as shown in the expression (4), the error $\epsilon$ of the measurement becomes large if the value of the value N of dividing is made small since the error $\epsilon$ of measurement is in inverse proportion to N.

Figure 7:
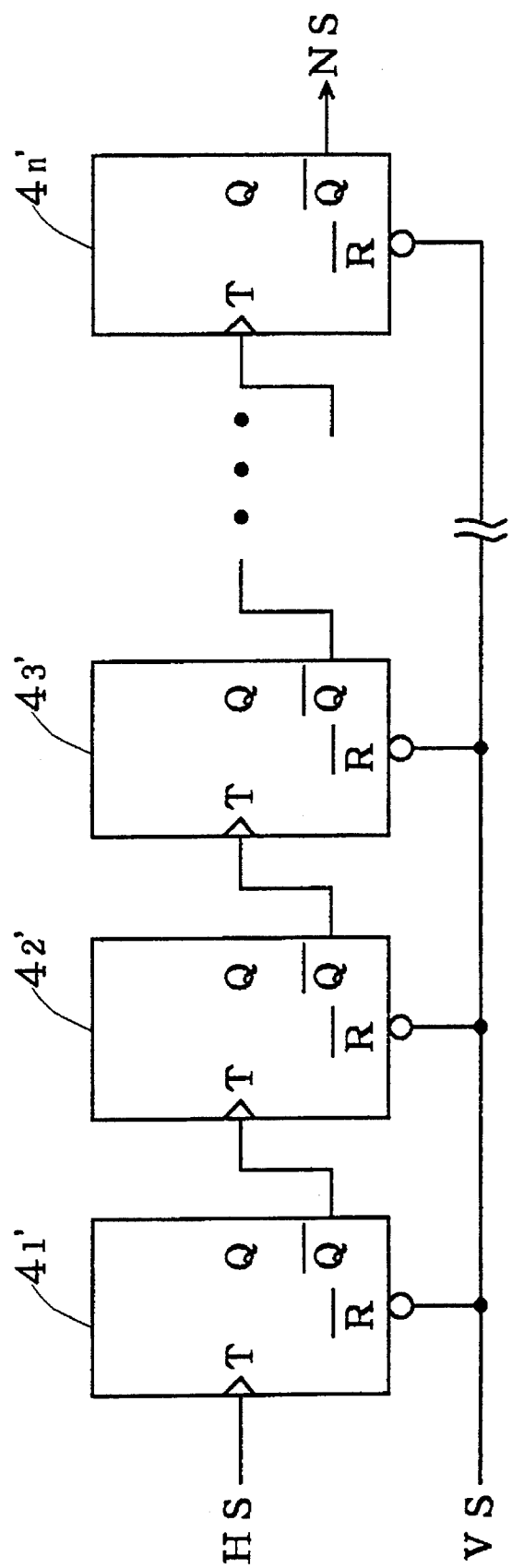
FIG. 7 is a circuit diagram showing an example of structure of the first preferred embodiment of the present invention.
Figure 9:
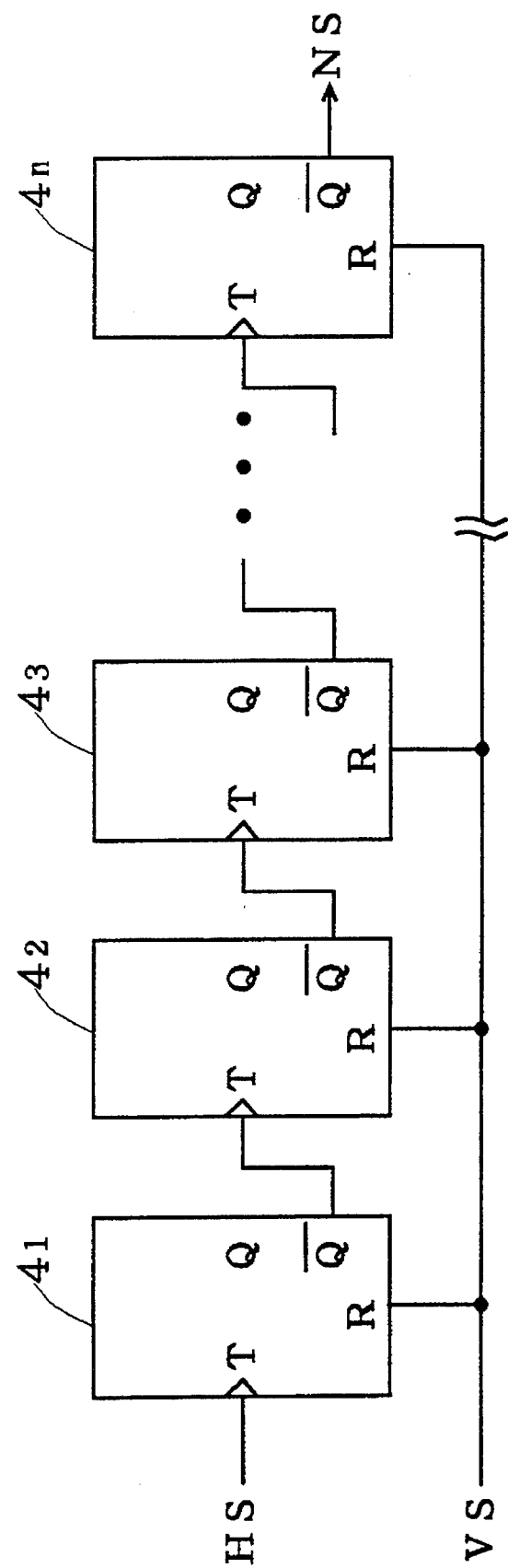
FIG. 9 is a circuit diagram showing an example of structure of the second preferred embodiment of the present invention.

FIG. 9 is a circuit diagram showing the structure of a dividing circuit 4c which is preferably used when determining the measurement period $t_M$ with falls of the divided signal NS. Although the structure is shown in which it is reset with the vertical synchronizing signal VS becoming "H" level as shown in FIG. 5, it can be similarly structured by using T flip-flops $4_1'$, $4_2'$, $4_3'$, ..., $4_n'$ having reset terminals which are reset with the signal becoming "L" level as shown in FIG. 7.

The dividing circuit $4c$ is the same as the dividing circuit $4a$ only except one point. It is different only in that the divided signal NS is obtained from the inversion Q output of the T flip-flop $4_n$.

FIG. 10 is a timing chart showing the measurement of the period of the horizontal synchronizing signal HS in the second preferred embodiment. Similarly to the first preferred embodiment shown in FIG. 4, the waiting time F of $(t_M/2-T_H+w)$ is sufficient. Accordingly, even if the measurement period $t_M$ is determined on the basis of falls of the divided signal NS, and also if the period of the vertical synchronizing signal VS is short, the period of the horizontal synchronizing signal HS can be measured accurately without making the value N of dividing small.

(B-3) Third Preferred Embodiment:

As has been described in the second preferred embodiment, when the period of the vertical signal VS is short, the value of the dividing value N must be made small. This is because the horizontal synchronizing signal HS may be lacking in the vicinity of the time when the vertical synchronizing signal VS is activated. In the third preferred embodiment, the period of the horizontal synchronizing signal HS is measured accurately without making the dividing value N small even if the period of the vertical synchronizing signal VS is short by making the starting time of the measurement period $t_M$ earlier.

The structure of a period measuring device according to the third preferred embodiment is also shown in FIG. 3 like the first though second preferred embodiments. In the third preferred embodiment, however, the structure of the divider 4 is different from those.

Figure 11:
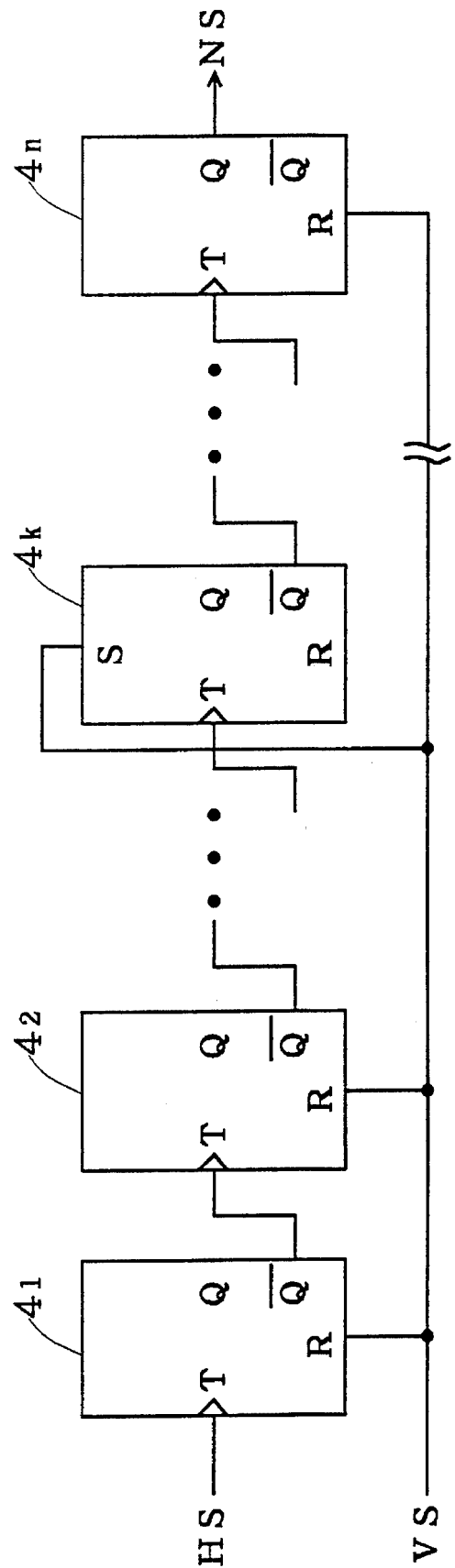
FIG. 11 is a circuit diagram showing an example of structure of the third preferred embodiment of the present invention.

FIG. 11 is a circuit diagram showing the structure of a dividing circuit $4d$ which is suitably used for the divider 4 in the third preferred embodiment. The dividing circuit $4d$ is different from the dividing circuit $4a$ only in one point. It is different only in that the vertical synchronizing signal VS is inputted to the k th stage of T flip-flop $4k$ not at a reset terminal but at a set terminal S.

With the "H" level of the vertical synchronizing signal VS, all the T flip-flops $4_1$, $4_2$ ..., $4_n$ other than the T flip-flop $4_k$ are reset. The T flip-flop $4_k$ only is set (preset). Accordingly, the value of preset of the dividing circuit $4d$ is $2^{(k-1)}$, and the divided signal NS rises when the rises of the horizontal synchronizing signal HS are counted only $2^{(n-k)}$ times, which is earlier than counting $2^{(n-1)}$ times.

Accordingly, the waiting time F from the inactivation of the vertical synchronizing signal VS to the start of the measurement period $t_M$ can be shortened than $(t_M/2-T_H+w)$ needed in the first and second preferred embodiments.

The flip-flop having the set terminal S to which the vertical synchronizing signal VS is applied for preset dose not have to be only one. A plurality of ones of the T flip-flops $4_2, 4_3 ..., 4_n$ may have set terminals S to which the vertical synchronizing signal VS is applied. In this case, if the preset value is P, the divided signal NS rises by counting $(2^{(n-1)}-P)$ times.

Figure 12:
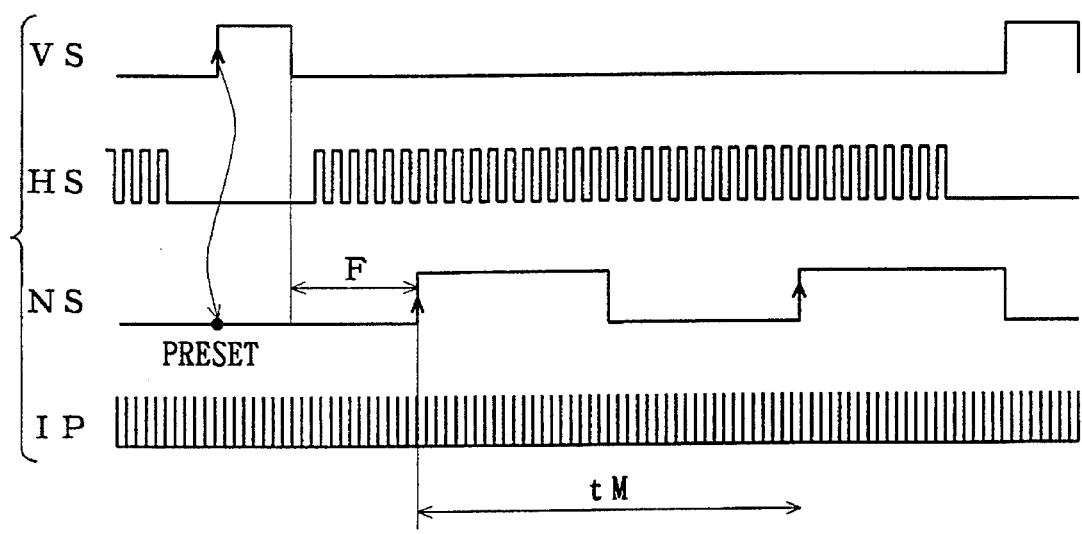
FIG. 12 is a timing chart showing the operation of the third preferred embodiment of the present invention.

FIG. 12 is a timing chart showing the operation of the third preferred embodiment. The divided signal NS can rise early since preset is made with the "H" level of the vertical synchronizing signal VS.

The third preferred embodiment is constructed and operates as described above, therefore, the period of the horizontal synchronizing signal HS can be measured accurately without making the dividing value N small even if the period of the vertical synchronizing signal VS is short.

(B-4) Fourth Preferred Embodiment:

In the first to third preferred embodiments, the measurement period $t_M$ is set as one period of the divided signal NS. In other words, the descriptions have been made about the cases in which the measurement period $t_M$ is equal to N (the dividing value) times the period $T_H$ of the horizontal synchronizing signal HS. The measurement period $t_M$, however, can be set to be equal to an integer multiple of a value which is half the period $T_H$. This can be made by selecting two arbitrary transitions of the divided signal NS and setting the measurement period $t_M$ between them.

Figure 13:
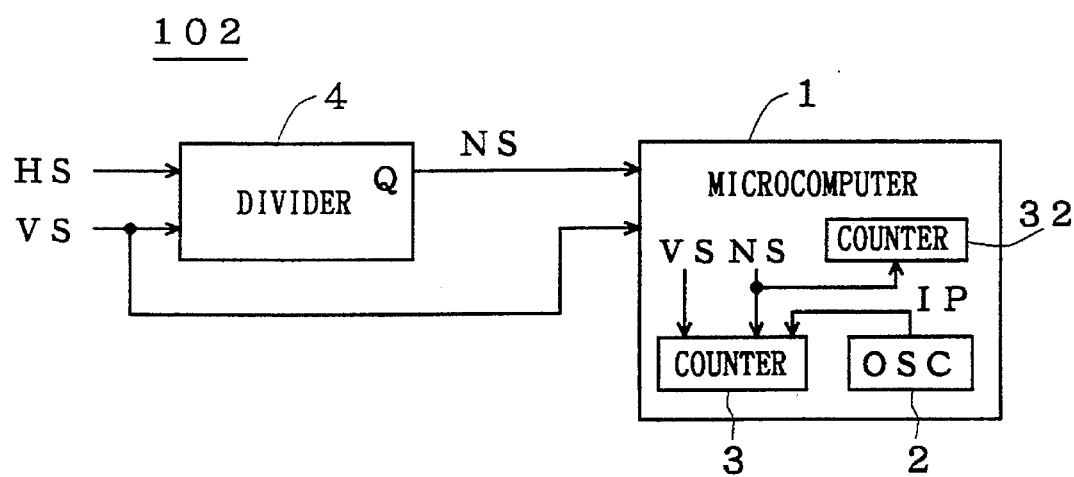
FIG. 13 is a block diagram showing the fourth preferred embodiment of the present invention.
Figure 14:
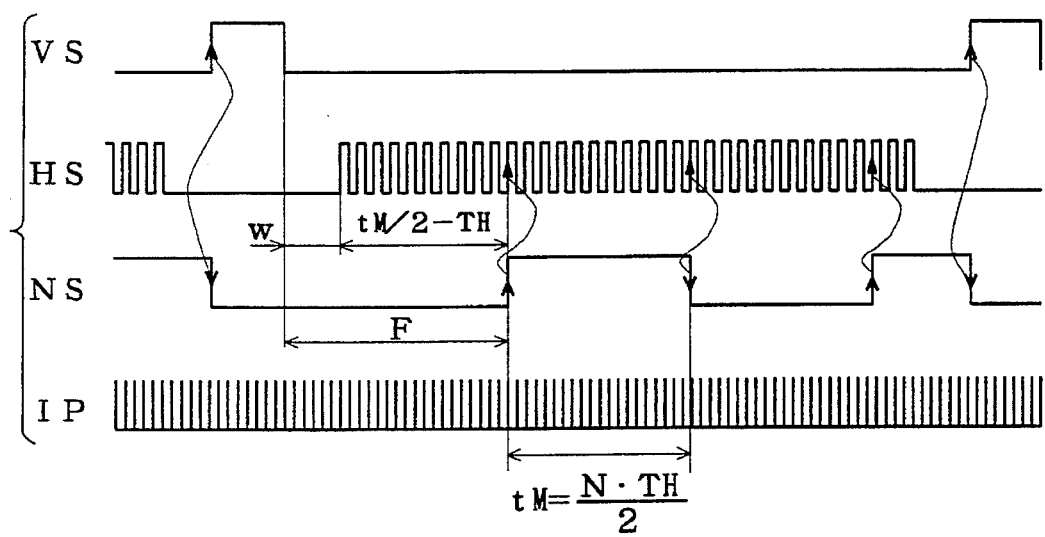
FIG. 14 is a timing chart showing the operation of the fourth preferred embodiment of the present invention.

The measurement period $t_M$ is set in that way in the fourth preferred embodiment, and FIG. 13 is a block diagram showing the structure of a period measuring device 102 according to the fourth preferred embodiment. In the structure, a counter 32 is newly provided to the period measuring device 101 according to the first preferred embodiment shown in FIG. 3. FIG. 14 is a timing chart showing the operation of the period measuring device 102, where the measurement period $t_M$ is set to $N \cdot T_H/2$.

Specifically, in setting such a measurement period $t_M$, the first transition of the divided signal NS after the vertical synchronizing signal VS becomes inactive is set as the starting point and the second transition of the divided signal NS is set as the end point.

Figure 15:
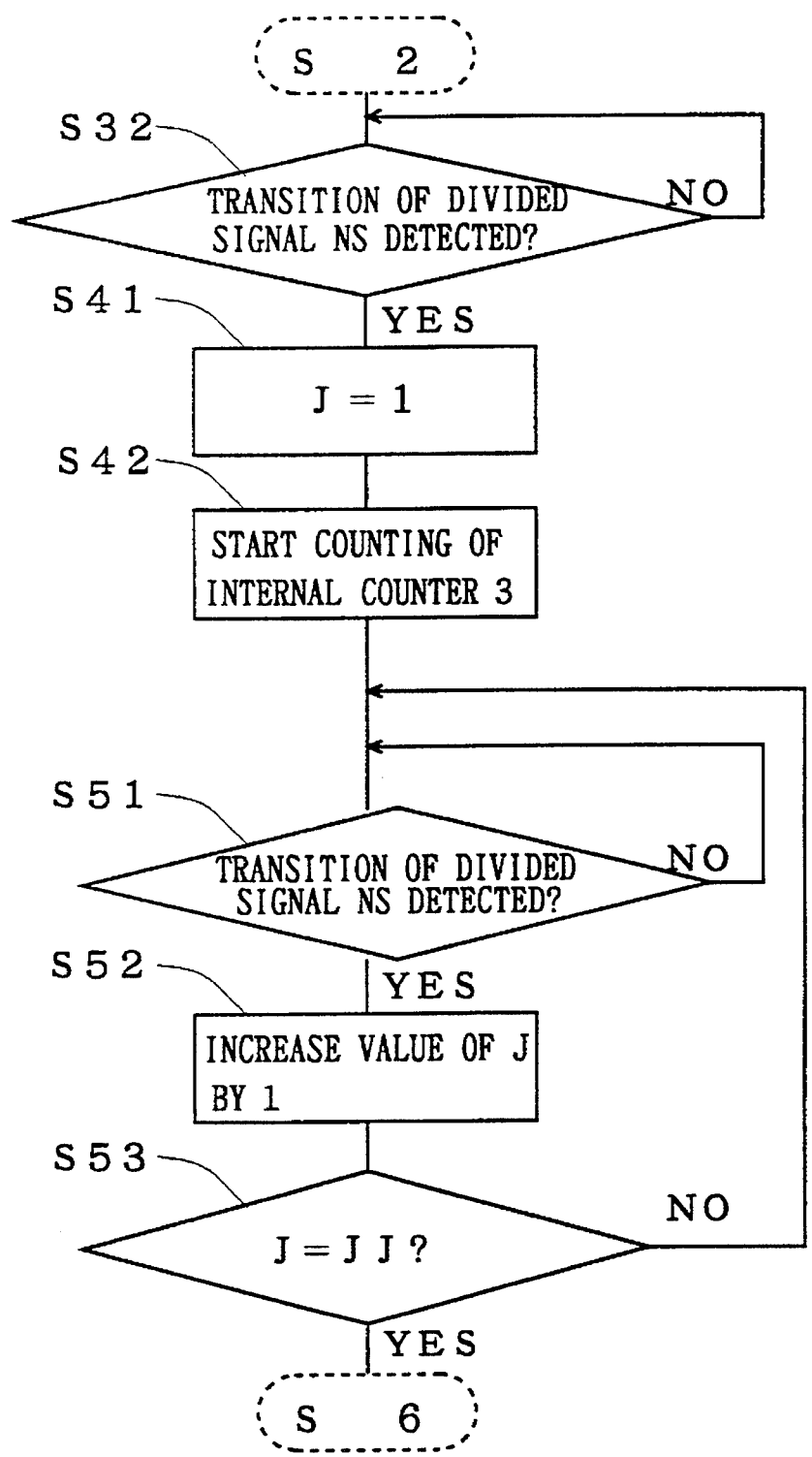
FIG. 15 is a flow chart showing part of the operation of the fourth preferred embodiment of the present invention.

FIG. 15 is a flow chart showing part of the operation of the period measuring device 102. By replacing steps S3, S4 and S5 shown in FIG. 6 by steps S32, S41, S42, S51, S52 and S53 shown here, the entire operation of the period measuring device 102 can be given.

Reset of the internal counter 3 is made by step S2 shown in FIG. 6 and then step S32 shown in FIG. 15 is performed. In step S32, a determination is made as to whether a transition, a rise or a fall, of the divided signal NS is detected or not. When it is not detected, step S32 is repeated.

In step S32, when a determination is made that a rise or a fall of the divided signal NS is detected, a value 1 is provided to a variable J in step S41. Then, the processing the same as step S4 in the first preferred embodiment is performed in step S42. Subsequently, the value of variable J is increased by 1 in step S52 every time a transition of the divided signal NS is detected in step S51. Such a value of the variable J is updated by the counter 32 shown in FIG. 13.

Then, in step S53, a determination is made as to if the value of the variable J reaches a predetermined value JJ or not. If it has not reached the predetermined value JJ, it returns to step S51 and the processings in steps S51 to S53 are repeated.

In the timing chart shown in FIG. 14, the value of the measurement period $t_M$ is equal to $N \cdot T_H/2$. The predetermined value JJ is selected to be 2 in such a case. Needless to say, the value of JJ can be set to other values such as 3, 4,...

The transition of the divided signal NS for setting the starting point of the measurement period $t_M$ does not necessarily have to be one which occurs for the first time after the vertical synchronizing signal VS is inactivated, but the second transition of the divided signal NS can be set as the starting point of the measurement period $t_M$. Because the waiting time F is desirably as short as possible as described in the second and the third preferred embodiments, however, it is desirable to set the measurement period $t_M$ with a starting point at the transition caused first time after the vertical synchronization signal VS is inactivated as in the fourth preferred embodiment.

Figure 16:
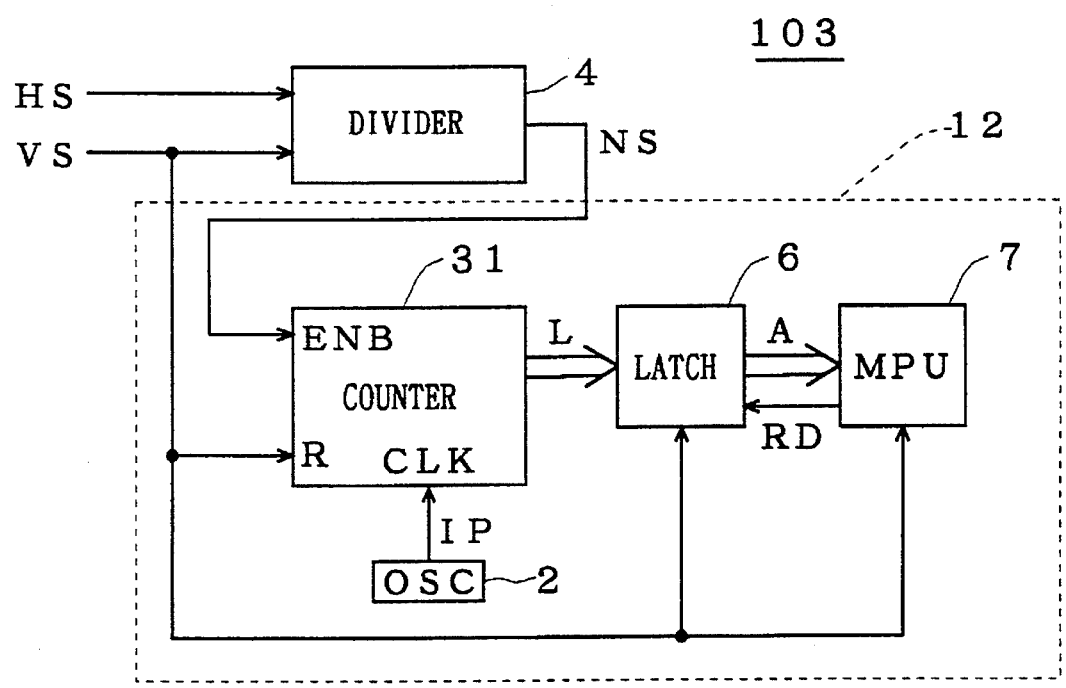
FIG. 16 is a block diagram showing the structure of the fifth preferred embodiment of the present invention.

(B-5) Fifth Preferred Embodiment:

FIG. 16 is a block diagram showing the structure of a period measuring device 103 according to the fifth preferred embodiment of the present invention. The period measuring device 103 has a structure in which the microcomputer 1 in the period measuring device 101 according to the first preferred embodiment is replaced by measuring means 12.

The measuring means 12 has an internal pulse oscillator 2 for generating the internal pulse IP, a counter 31, a latch 6 and a micro-processor (MPU) 7. The measuring means 12 dose not necessarily have to be a microcomputer, but may be a microcomputer. The internal pulse oscillator 2, the counter 31, the divider 4 and the latch 6 can he formed on the same semiconductor chip.

Figure 17:
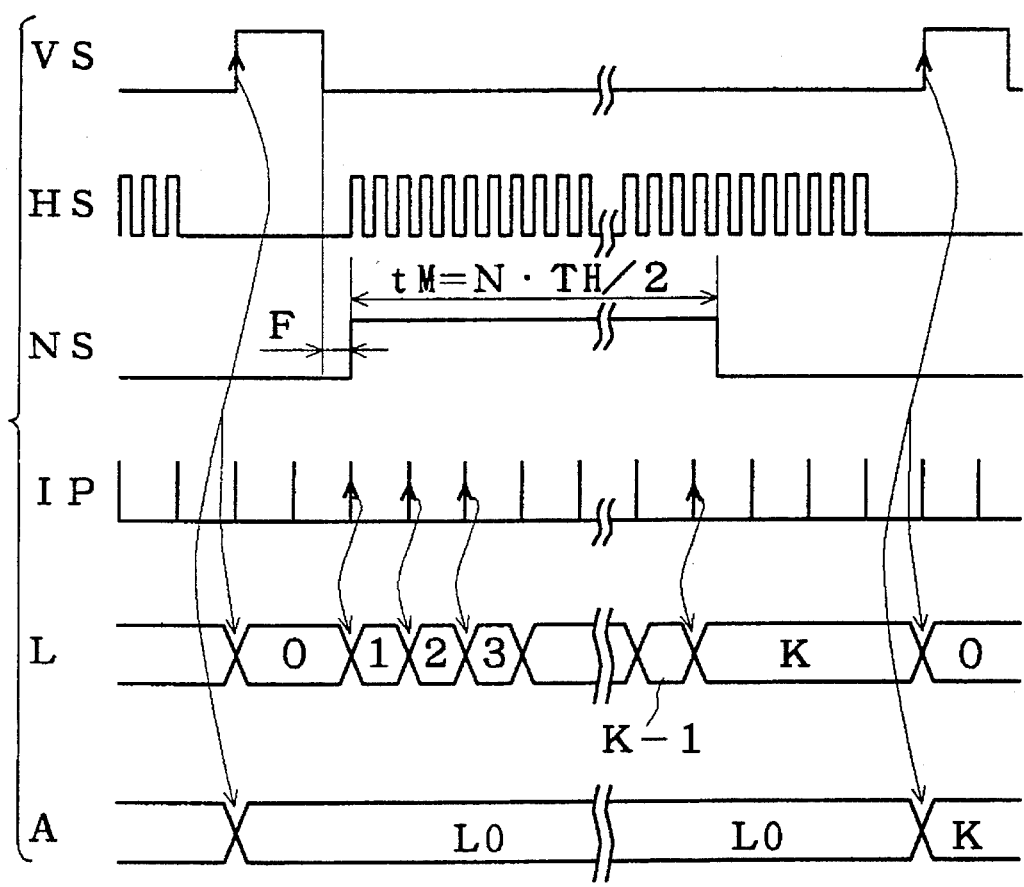
FIG. 17 is a timing chart showing the operation of the fifth preferred embodiment of the present invention.

FIG. 17 is a tinting chart showing the operation of the period measuring device 103. In order to simplify the description, however, the intervals of the internal pulse IP are drawn wider. The counter 31 is reset by the rise of the vertical synchronizing signal VS. It may be reset by a fall. The waiting time F from the vertical synchronizing signal VS to the rise of the divided signal NS can be suitably shortened by applying the third preferred embodiment, for example.

The divided signal NS which is obtained by N-dividing the horizontal synchronizing signal HS by the divider 4 is inputted to an enable terminal ENB of the counter 31, and when its value becomes "H", the counter 31 gets into the measurable state (count enable). The counter 31 in the count enable counts the internal pulse IP inputted to its clock terminal CLK like 0, 1, 2 . . . Then, When the value of the divided signal NS becomes "L", the counter 31 becomes unmeasurable (count disable), and the counter 31 stops counting the internal pulse IP at the number K.

Accordingly, the measurement period $t_M$ is half of the measurement time $t_M$ in the first through third preferred embodiments, that is, $N \cdot T_H/2$, where the period of the vertical synchronizing signal VS dose not have to be as long as one period of the divided signal NS, but a half of it is enough.

The output of the counter 31 which takes the value K is applied to the latch 6. The vertical synchronizing signal VS is applied to the latch 6 as a latch signal, where the value of the latch 6 is held at the rise thereof. That is to say, the vertical synchronizing signal VS resets the counter 31 and also serves to have the latch 6 hold the value thereof.

If the period of the vertical synchronizing signal VS is only as long as half the period of the divided signal NS, the counter 31 is count disable at least immediately before the vertical synchronizing signal VS rises, and its output L does not depend on the period of the vertical synchronizing signal .VS. The output A of the latch 6 at a certain time holds the value which the counter 31 counted between the vertical synchronizing signal VS which rose before that time and the vertical synchronizing signal VS which rose further before. The counter 31 is reset by one located on the left of the rises of the vertical synchronizing signal VS shown in FIG. 17, and the output A of the latch 6 holds the value $L_o$ of the output L of the counter 31 which has been determined immediately before that. The counter 31 is reset by one located on the right and the output A of the latch 6 holds the value K of the output L of the counter 31 which has been determined immediately before that.

The MPU 7 provides a read signal RD to the latch 6 and inputs the output A to obtain the value K. Using the value K thus obtained, the period of the horizontal synchronizing signal HS is obtained as $T=2T_S \cdot K/N$. Such a process is performed in the MPU 7. As the measurement period $t_M$ becomes half in the fifth preferred embodiment, the error $\epsilon$ is doubled as compared with the first preferred embodiment, i.e., $2T_S/N$. As in the first preferred embodiment, however, a longer period of the horizontal synchronizing signal HS dose not deteriorate the accuracy.

Furthermore, the output A can be obtained any time except in writing of the latch 6 in the fifth preferred embodiment. Accordingly, the MPU 7 can obtain the output L of the counter 31 stably by reading it in synchronization with a fall of the vertical synchronizing signal VS.

Figure 18:
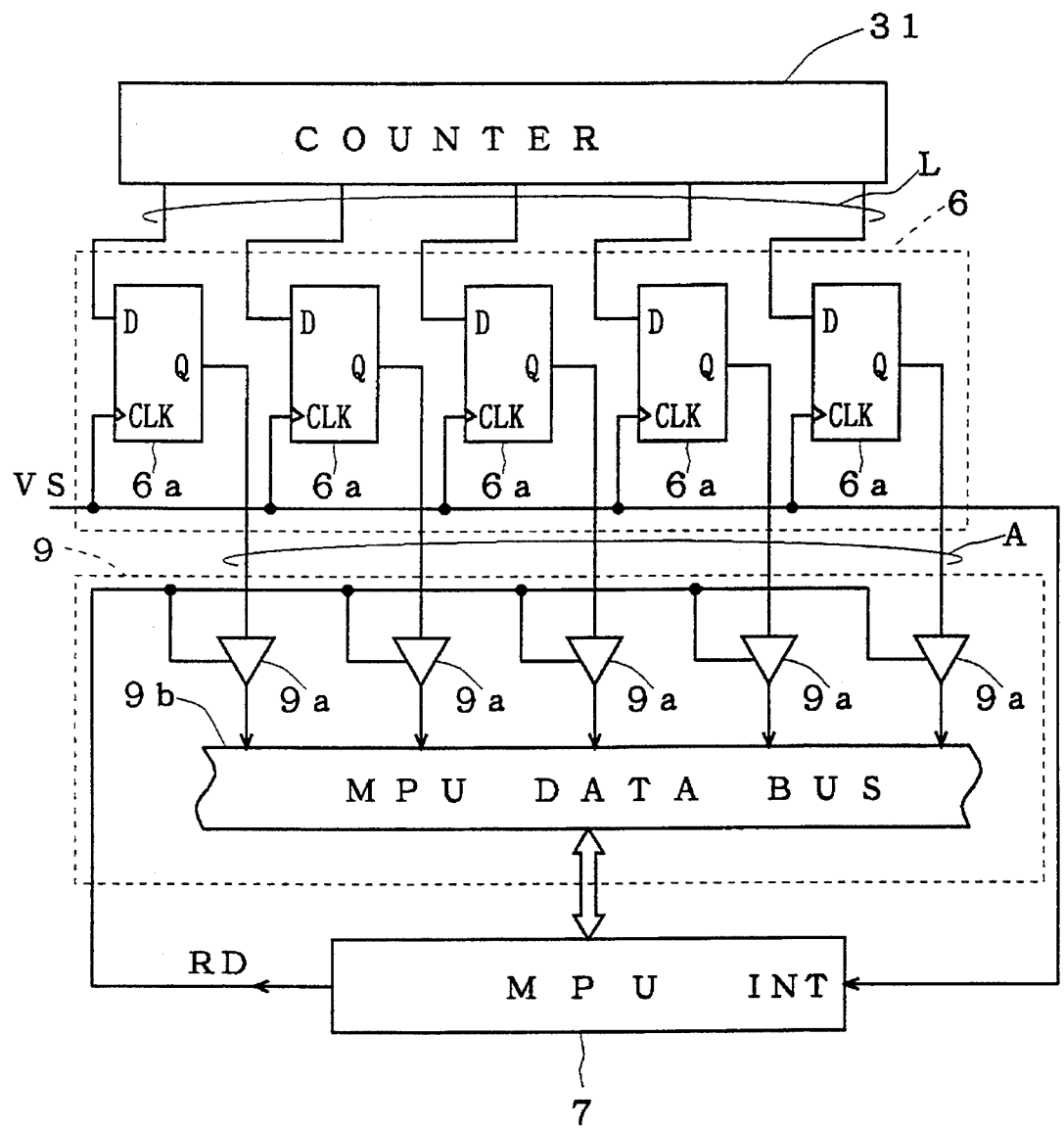
FIG. 18 is a structure diagram showing the structure of the fifth preferred embodiment of the present invention.

FIG. 18 is a structure diagram showing the structure of a buffer 9 which is suitable to be used when the output A of the latch 6 is provided to the MPU 7 in synchronization with a fall of the vertical synchronizing signal VS and the relation of connection with the latch 6 and the MPU 7.

The manner of the output L of the counter 31 is of parallel and the latch 6 has a plurality of D flip-flops 6a in parallel correspondingly. The buffer 9 has a plurality of tri-state buffers 9a arranged in parallel and a MPU data bus 9b.

The vertical synchronizing signal VS is provided to a clock terminal CLK of the D flip-flop 6a, at whose rise the value of the D input is latched to the Q output.

The read signal RD is provided to the tri-state buffer 9a, and when it is activated, the value provided to the input end of the tri-state buffer 9a is provided to its output end. When it is inactivated, the output end of the tri-state buffer 9a goes to the high impedance state.

The MPU 7 includes an interruption terminal INT for accepting the interruption process, to which the vertical synchronizing signal VS is inputted. When the vertical synchronizing signal VS falls, the read signal RD is activated in a certain period and the output A of the latch 6 is applied to the MPU 7 through the MPU data bus 9b.

(B-6) Sixth Preferred Embodiment:

It was shown in the fifth preferred embodiment that it can produce effects if the period of the vertical synchronizing signal VS is only as long as half of the period of the divided signal NS. However, a problem will be caused if the period of the vertical synchronizing signal VS is equal to or longer than one period of the divided signal NS.

Figure 19:
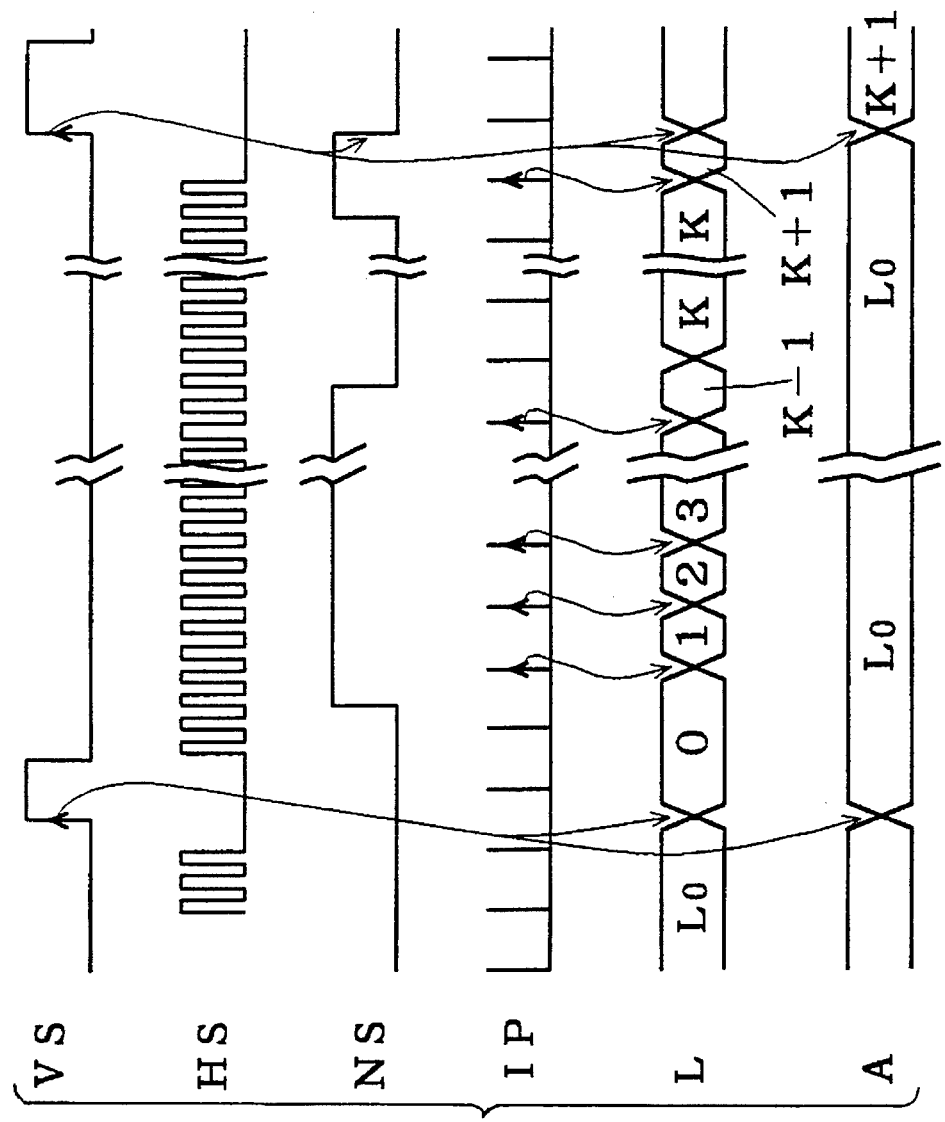
FIG. 19 is a timing chart for illustrating the problem of the fifth preferred embodiment of the present invention.

FIG. 19 is a tinting chart for illustrating such a problem in the fifth preferred embodiment. As shown in FIG. 19, if the level of the divided signal NS goes to "H" a plurality of times in the period when the vertical synchronizing signal VS is continuously inactive, the counter 31 further increases the value of its output L. Therefore, the period of the horizontal synchronizing signal HS can not be obtained by multiplying the obtained value by $2T_S/N$, where the effects of the fifth preferred embodiment can not be expected.

In the sixth preferred embodiment, to avoid such a problem, the divided signal NS is produced so that the level of the divided signal NS does not go to "H" a plurality of times in the period in which the vertical synchronizing signal VS is continuously inactive.

Figure 20:
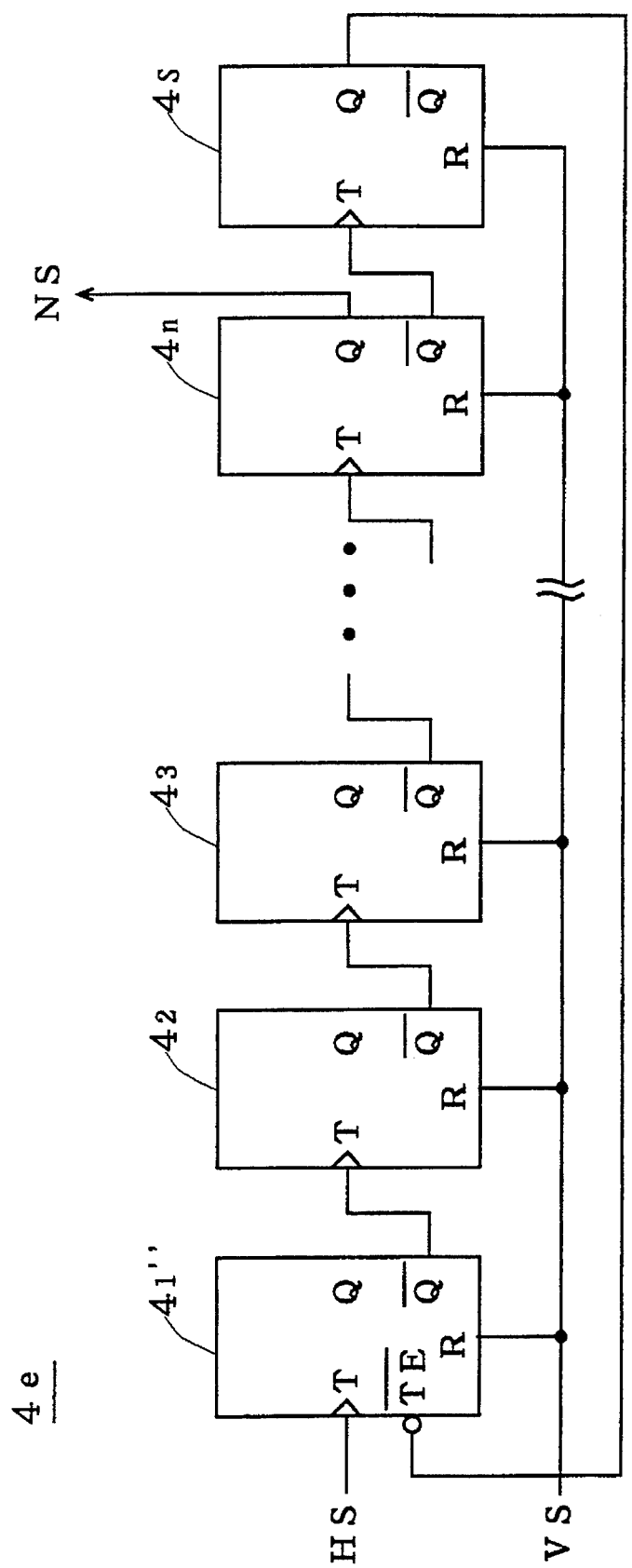
FIG. 20 is a circuit diagram showing the structure of the sixth preferred embodiment.

FIG. 20 is a circuit diagram showing the structure of a dividing circuit 4e which is suitable to be used in the sixth preferred embodiment. By using the dividing circuit 4e for the divider 4 included in the period measuring device 103 shown in FIG. 16, the sixth preferred embodiment is realized. In the structure of the dividing circuit 4e, the T flip-flop $4_1$ in the dividing circuit 4a shown in FIG. 5 is replaced by a T flip-flop $4_1"$ having a toggle disable terminal TE (negative logic), and a T flip-flop $4s$ is added after the T flip-flop $4_n$ at the final stage in the dividing circuit 4a.

More specifically, the horizontal synchronizing signal HS is applied to the clock input terminal T of the T flip-flop $4_1''$. An inversion Q output thereof is then applied to the clock input terminal T of the T flip-flop $4_2$ and an inversion Q output thereof is applied to the clock input terminal T of the T flip-flop $4_3$. The T flip-flops a $4_1''$, $4_2$, . . . , $4_n$, $4_S$ are thus sequentially connected, and the Q output of the T flip-flop $4_S$ is applied to the toggle disable terminal TE of the T flip-flop $4_1''$. The vertical synchronizing signal VS is applied to reset terminals R of all the T flip-flops $4_1''$, $4_2$, . . . , $4_n$, $4_S$.

Now, if the Q output of the T flip-flop 4 is taken as the divided signal NS, when the divided signal NS falls, that is, when the divided signal NS goes to the "L" level, the inversion Q output of the T flip-flop $4_n$ rises. Accordingly, the Q output of the T flip-flop $4_S$ which was reset in advance by the vertical synchronizing signal VS and is at the "L" level goes to the "H" level to bring the T flip-flop $4_1''$ at the first stage in the dividing circuit 4e to the disable state. Therefore, after the divided signal NS once goes to "L", the divided signal NS does not take the "H" level again unless the vertical synchronizing signal VS is activated preset all the T flip-flops $4_1''$, $4_2$, . . . , $4_n$, $4_S$.

In the sixth preferred embodiment which is configured and operates as described above, inadequate counting which may possibly occurs in the fifth preferred embodiment will not be caused, and besides the same effects as the fifth preferred embodiment can be obtained.

C. OTHER EXAMPLES OF MODIFICATIONS:

In the preferred embodiments described above, the vertical synchronizing signal VS is used as the reset signal for the divider 4 as it is, or used as a trigger for preset. As can be understood from the descriptions on the operations of the preferred embodiments, however, it is not necessary to define the period in which the vertical synchronizing signal VS is active to a particular length in the present invention.

Also, the divided signal NS is produced directly from the horizontal synchronizing signal HS in the above-described preferred embodiments, but since transitions such as rises of the horizontal synchronizing signal HS are counted in generating the divided signal NS, the length of its activation is not a serious problem.

Figure 21:
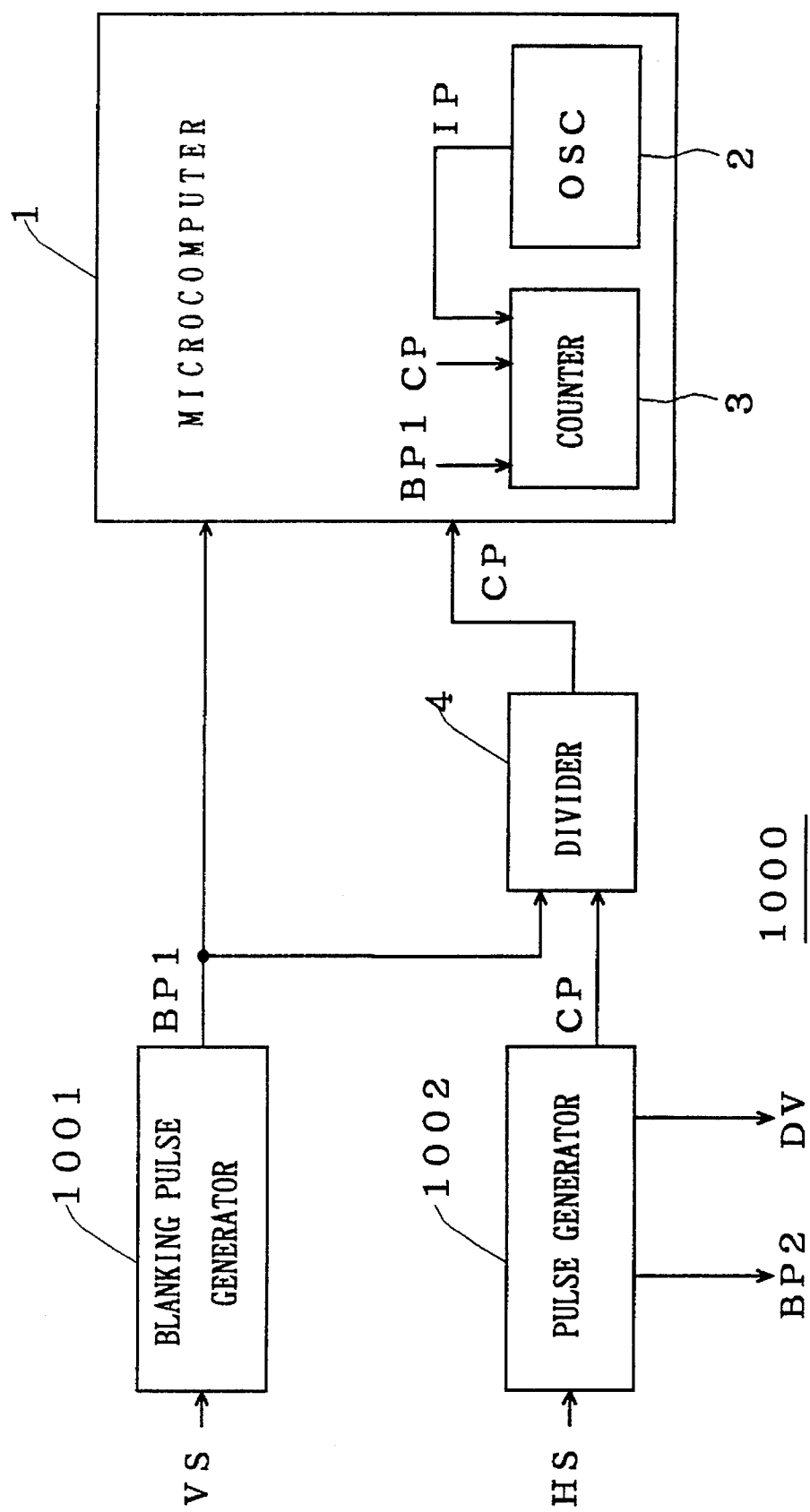
FIG. 21 is a conceptional diagram showing an example of modification of the present invention.
Figure 22:
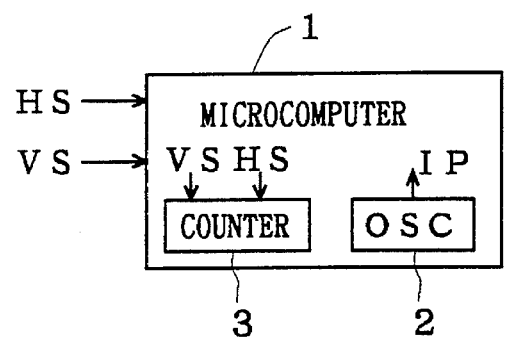
FIG. 22 is a block diagram showing the conventional art.
Figure 23:
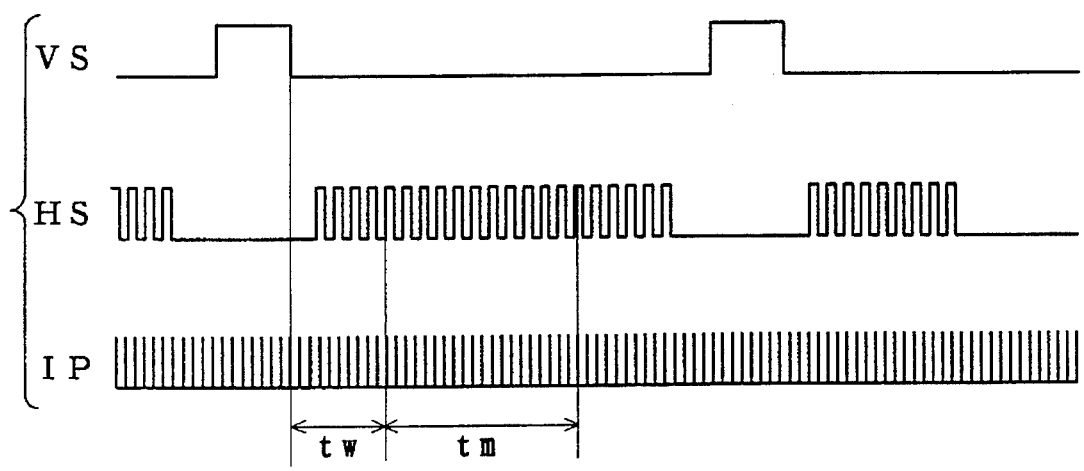
FIG. 23 is a timing chart showing the conventional art.

On the other hand, the pulse widths of the horizontal synchronizing signal HS and the vertical synchronizing signal VS are controlled to separately produce new signals in the monitor. FIG. 21 is a conceptional diagram for exemplifying the application to this invention of the signals produced by controlling the pulse widths of the horizontal synchronizing signal HS and the vertical synchronizing signal VS in the monitor. For example, the blanking pulse BP1 is produced by the blanking pulse producing portion 1001 from the vertical synchronizing signal VS and the blanking pulse BP2, the clamp pulse CP and the drive pulse DV are produced by a pulse producing portion 1002 from the horizontal synchronizing signal HS.

Accordingly, as shown in FIG. 21, the same effects as the first preferred embodiment can be obtained by performing reset of the divider 4 using the blanking pulse BP1 in place of the vertical synchronizing signal VS and producing the divided signal NS by dividing the clamp pulse CP in place of the horizontal synchronizing signal HS. In other preferred embodiments, the same effects can also be obtained by making such substitutions.

While the invention has been shown and described in detail, the foregoing description is in all aspects illustrative and not restrictive. It is therefore understood that numerous modifications and variations can be devised without departing from the scope of the invention.

What is claimed is:

1. A period measuring device for measuring a period of a first signal which is periodically activated, comprising:

(a) an input terminal for inputting a second signal which has a period larger than that of said first signal and has a predetermined relation with said first signal;

(b) an oscillator for generating a third signal which has a period smaller than that of said first signal;

(c) a first counter for counting the number of times of activation of said third signal in a measurement period determined by said second signal;

(d) operation means for obtaining the period of said first signal from an output of said first counter, the period of said third signal and said predetermined relation; and (e) a divider for N-dividing said first signal to generate said second signal and supplying it to said input terminal;

wherein said first counter is activated after a fourth signal is detected and said first counter counts the number of times of activation of said third signal during a next full period of the second signal after the fourth signal activates the counter.

2. The period measuring device according to claim 1, wherein said predetermined relation is that the period of said second signal is an integer N multiple of the period of said first signal.

3. The period measuring device according to claim 2, further comprising: (e) a divider for N-dividing said first signal to generate said second signal and supplying it to said input terminal.

4. The period measuring device according to claim 3 wherein said first signal is activated at least when the fourth signal which is periodically activated is inactive, and said divider has a second counter which is supplied with an initial value by said fourth signal which is active, and said second signal is obtained as output of said second counter.

5. The period measuring device according to claim 4, wherein said second counter has a series connection of a plurality of T flip-flops, said T flip-flop positioned on the first stage has a clock terminal, and said first signal is applied to said clock terminal.

6. The period measuring device according to claim 5, wherein said fourth signal is applied to set terminals or reset terminals of said T flip-flop.

7. The period measuring device according to claim 4, wherein said first signal and fourth signal are a horizontal synchronizing signal and a vertical synchronizing signal of a picture signal, respectively.

8. The period measuring device according to claim 4, wherein said first signal and fourth signal are ones obtained by controlling pulse widths of a horizontal synchronizing signal and a vertical synchronizing signal of a picture signal, respectively.

9. The period measuring device according to claim 4, wherein said measurement period is an integer multiple of half of one period of said second signal.

10. The period measuring device according to claim 9, further comprising:

(f) a third counter for counting transition of said second signal, wherein said measurement period is set using output of said third counter.

11. The period measuring device according to claim 9, wherein said measurement period corresponds to one period of said second signal.

12. The period measuring device according to claim 11, wherein said first counter performs said counting only between adjacent transitions of said second signal having the same direction.

13. The period measuring device according to claim 12, wherein said measurement period starts at the time when said second signal makes transition for the first time after said fourth signal becomes inactive.

14. The period measuring device according to claim 11, wherein said operation means multiplies the period of said third signal by the output of said first counter and divides a result thereof by said N to obtain the period of said first signal.

15. The period measuring device according to claim 9, wherein said measurement period corresponds to a half period of said second signal.

16. The period measuring device according to claim 15, wherein said first counter performs said counting only between adjacent transitions of said second signal having directions different from each other.

17. The period measuring device according to claim 16, wherein said measurement period starts from the time when said second signal makes transition for the first time after said fourth signal becomes inactive.

18. A period measuring device for measuring a period of a first signal which is periodically activated, comprising:
   (a) an input terminal for inputting a second signal which has a period larger than that of said first signal and a period of said second signal is an integer N multiple of the period of said first signal;
   (b) a oscillator for generating a third signal which has a period smaller than that of said first signal;
   (c) a first counter for counting the number of times of activation of said third signal in a measurement period which is an integer multiple of half of one period of said second signal, wherein said first counter performs said counting only between adjacent transitions of said second signal having directions different from each other, and wherein said measurement period starts from the time when said second signal makes transition for the first time after said fourth signal becomes inactive;
   (d) operation means for obtaining the period of said first signal from an output of said first counter, the period of said third signal and said predetermined relation, wherein said operation means multiples the period of said third signal by the output of said first counter, further multiplies by 2 and divides a result thereof by said N to obtain the period of said first signal.

19. A period measuring device for measuring a period of a first signal which is periodically activated, comprising:
   (a) an input terminal for inputting a second signal which has a period larger than that of said first signal and a period of said second signal is an integer N multiple of the period of said first signal;
   (b) an oscillator for generating a third signal which has a period smaller than that of said first signal;
   (c) a first counter for counting the number of times of activation of said third signal in a measurement period which is an integer multiple of half of one period of said second signal;
   (d) operation means for obtaining the period of said first signal from an output of said first counter, the period of said third signal and said predetermined relation;
   (e) a divider for N-dividing said first signal to generate said second signal and supplying it to said input terminal;
   (f) latch means for holding an output of said first counter; and
   (g) read means for inputting an output of said latch means, wherein
   a first transition from inactive to active of said fourth signal causes reset of said first counter and said holding of said latch means, and
   said first counter performs said counting only between adjacent transitions having directions different from each other of said second signal.

20. The period measuring device according to claim 19, wherein, caused by a second transition complementary to said first transition of said fourth signal, said read means inputs output of said latch means.

21. The period measuring device according to claim 19, wherein said second signal makes only two transitions having different directions in a period in which said fourth signal is continuously inactive.

22. The period measuring device according to claim 21, wherein
   said second counter has a series connection of a plurality of T flip-flops,
   said T flip-flop positioned on the first stage includes,
   a clock terminal to which said first signal is applied, and
   a count enable terminal to which output of said T flip-flop positioned on the final stage is applied.

* * * * *